(12) United States Patent
Yamada et al.

(10) Patent No.: US 9,385,275 B2
(45) Date of Patent: Jul. 5, 2016

(54) NITRIDE SEMICONDUCTOR LIGHT-EMITTING DIODE

(71) Applicant: Panasonic Intellectual Property Management Co., Ltd., Osaka (JP)

(72) Inventors: Atsushi Yamada, Osaka (JP); Akira Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/830,713

(22) Filed: Aug. 19, 2015

(65) Prior Publication Data

US 2015/0357522 A1    Dec. 10, 2015

Related U.S. Application Data

(63) Continuation of application No. 14/493,481, filed on Sep. 23, 2014, now Pat. No. 9,147,807.

(30) Foreign Application Priority Data

Apr. 8, 2014   (JP) .................................. 2014-079114

(51) Int. Cl.
*H01L 33/00* (2010.01)
*H01L 33/24* (2010.01)
(Continued)

(52) U.S. Cl.
CPC ............ *H01L 33/24* (2013.01); *H01L 33/0025* (2013.01); *H01L 33/0075* (2013.01); *H01L 33/16* (2013.01); *H01L 33/20* (2013.01); *H01L 33/32* (2013.01); *H01L 33/38* (2013.01)

(58) Field of Classification Search
CPC . H01L 33/24; H01L 33/0025; H01L 33/0075; H01L 33/16; H01L 33/20; H01L 33/32; H01L 33/38

USPC ........................................................... 257/98
See application file for complete search history.

(56) References Cited

U.S. PATENT DOCUMENTS 7,550,775 B2 *  6/2009  Okuyama ............... H01L 33/20
                                                                    257/94
7,994,527 B2    8/2011  DenBaars et al.
(Continued)

FOREIGN PATENT DOCUMENTS

JP       09-082587       3/1997
JP       10-326910       12/1998
(Continued)

OTHER PUBLICATIONS

U.S. Office Action dated Mar. 11, 2015 issued in U.S. Appl. No. 14/493,481.
(Continued)

*Primary Examiner* — Tod T Van Roy
*Assistant Examiner* — Vu A Vu
(74) *Attorney, Agent, or Firm* — McDermott Will & Emery LLP

(57) ABSTRACT

In a nitride semiconductor light-emitting diode having a shape of an isosceles triangle in a top view, either Group Aa consisting of the following two mathematical formulae (Ia) and (IIa) or Group Ab consisting of the following two mathematical formulae (Ib) and (IIb) is satisfied:

20 degrees≤Angle degree α≤40 degrees (Ia) and 0 degrees≤Angle degree θ≤40 degrees (IIa)    Group Aa:

90 degrees≤Angle degree α≤130 degrees (Ib) and 50 degrees≤Angle degree θ≤90 degrees (IIb).    Group Ab:

2 Claims, 13 Drawing Sheets

(51) Int. Cl.
*H01L 33/20* (2010.01)
*H01L 33/38* (2010.01)
*H01L 33/16* (2010.01)
*H01L 33/32* (2010.01)

(56) References Cited

U.S. PATENT DOCUMENTS

| | | | |
|---|---|---|---|
| 8,114,698 | B2 | 2/2012 | Zhong et al. |
| 8,217,418 | B1 | 7/2012 | Pan et al. |
| 8,293,551 | B2 | 10/2012 | Sharma et al. |
| 8,624,292 | B2 | 1/2014 | Pan et al. |
| 2010/0047947 | A1 | 2/2010 | Yashima et al. |
| 2012/0205617 | A1 | 8/2012 | Pan et al. |
| 2013/0037779 | A1 | 2/2013 | Takeoka et al. |
| 2013/0126902 | A1 | 5/2013 | Isozaki et al. |
| 2013/0175566 | A1 | 7/2013 | Inoue et al. |

FOREIGN PATENT DOCUMENTS

| | | |
|---|---|---|
| JP | 2009-071174 | 4/2009 |
| JP | 2010-098068 A | 4/2010 |
| JP | 2012-023249 A | 2/2012 |

OTHER PUBLICATIONS

U.S. Notice of Allowance dated Jun. 10, 2015 issued in U.S. Appl. No. 14/493,481.

\* cited by examiner

NITRIDE SEMICONDUCTOR LIGHT-EMITTING DIODE

RELATED APPLICATIONS

This application is a continuation of U.S. patent application Ser. No. 14/493,481, filed on Sep. 23, 2014 which in turn claims the benefit of Japanese Patent Application No. 2014-079114 filed on Apr. 8, 2014, the disclosures of which applications are incorporated by reference herein.

BACKGROUND

1. Field of the Invention

The present invention relates to a nitride semiconductor light-emitting diode.

2. Description of the Related Art

Japanese Patent Application laid-open Publication No. 2012-023249A discloses a nitride semiconductor light-emitting diode. FIG. 13 shows a nitride semiconductor light-emitting diode disclosed in FIG. 3G included in Japanese Patent Application laid-open Publication No. 2012-023249A. Japanese Patent Application laid-open Publication No. 2012-023249A discloses in the paragraph [0199] that a nitride semiconductor light-emitting diode having a shape of a scalene triangle in a top view has higher light extraction efficiency than a nitride semiconductor light-emitting diode having a shape of a regular triangle.

More specifically, Japanese Patent Application laid-open Publication No. 2012-023249A discloses in the paragraph [0200] that the light extraction efficiency of the scalene triangle nitride semiconductor light-emitting diode shown in FIG. 13 is 1.4 times as high as that of a regular triangle nitride semiconductor light-emitting diode.

Furthermore, Japanese Patent Application laid-open Publication No. 2012-023249A discloses in the paragraph [0466] that it is most desirable that a nitride substrate included in the nitride semiconductor light-emitting diode has a (1-100) plane.

SUMMARY

The present invention provides a nitride semiconductor light-emitting diode comprising:
a non-polar or semi-polar p-type nitride semiconductor layer;
a non-polar or semi-polar active layer;
a non-polar or semi-polar n-type nitride semiconductor layer;
a p-side electrode; and
an n-side electrode, wherein
the active layer is interposed between the p-type nitride semiconductor layer and the n-type nitride semiconductor layer;
the p-type nitride semiconductor layer and the n-type nitride semiconductor layer are electrically connected to the p-side electrode and the n-side electrode, respectively;
the nitride semiconductor light-emitting diode has a shape of a triangle composed of Side BC, Side CA, and Side AB having a length of La, a length of Lb, and a length of Lc, respectively, in a top view of the nitride semiconductor light-emitting diode;
angles opposite to Side BC, Side CA, and Side AB have Angle degree $\alpha$, Angle degree $\beta$, and Angle degree $\gamma$, respectively, in the triangle;
Angle degree $\theta$ is formed between a c-axis and a longitudinal direction of Side BC in the top view,
the length Lb is equal to the length Lc, and
either Group Aa consisting of the following two mathematical formulae (Ia) and (IIa) or Group Ab consisting of the following two mathematical formulae (Ib) and (IIb) is satisfied.

Group Aa: 20 degrees≤Angle degree $\alpha$≤40 degrees (Ia) and 0 degrees≤Angle degree $\theta$≤40 degrees (IIa)

Group Ab: 90 degrees≤Angle degree $\alpha$≤130 degrees (Ib) and 50 degrees≤Angle degree $\theta$≤90 degrees (IIb)

The present invention provides another nitride semiconductor light-emitting diode comprising:
a non-polar or semi-polar p-type nitride semiconductor layer;
a non-polar or semi-polar active layer;
a non-polar or semi-polar n-type nitride semiconductor layer;
a p-side electrode; and
an n-side electrode, wherein
the active layer is interposed between the p-type nitride semiconductor layer and the n-type nitride semiconductor layer;
the p-type nitride semiconductor layer and the n-type nitride semiconductor layer are electrically connected to the p-side electrode and the n-side electrode, respectively;
the nitride semiconductor light-emitting diode has a shape of a triangle composed of Side BC, Side CA, and Side AB having a length of La, a length of Lb, and a length of Lc, respectively, in a top view of the nitride semiconductor light-emitting diode;
angles opposite to Side BC, Side CA, and Side AB have Angle degree $\alpha$, Angle degree $\beta$, and Angle degree $\gamma$, respectively, in the triangle;
Angle degree $\theta$ is formed between a c-axis and a longitudinal direction of Side BC in the top view;
Angle degree $\gamma$ is equal to 90 degrees; and
any one of Group Ba consisting of the following two mathematical formulae (IIIa) and (IVa), Group Bb consisting of the following two mathematical formulae (IIIb) and (IVb), or Group Bc consisting of the following two mathematical formulae (IIIc) and (IVc) is satisfied.

Group Ba: 10 degrees≤Angle degree $\alpha$≤30 degrees (IIIa) and −30 degrees≤Angle degree $\theta$≤45 degrees (IVa)

Group Bb: 30 degrees<Angle degree $\alpha$≤35 degrees (IIIb) and −25 degrees≤Angle degree $\theta$≤45 degrees (IVb)

Group Bc: 35 degrees<Angle degree $\alpha$≤40 degrees (IIIc) and 10 degrees≤Angle degree $\theta$≤45 degrees (IVc)

The present invention provides still another nitride semiconductor light-emitting diode comprising:
a non-polar or semi-polar p-type nitride semiconductor layer;
a non-polar or semi-polar active layer;
a non-polar or semi-polar n-type nitride semiconductor layer;
a p-side electrode; and
an n-side electrode, wherein
the active layer is interposed between the p-type nitride semiconductor layer and the n-type nitride semiconductor layer;
the p-type nitride semiconductor layer and the n-type nitride semiconductor layer are electrically connected to the p-side electrode and the n-side electrode, respectively;
the nitride semiconductor light-emitting diode has a shape of a triangle composed of Side BC, Side CA, and Side AB having a length of La, a length of Lb, and a length of Lc, respectively, in a top view of the nitride semiconductor light-emitting diode;

angles opposite to Side BC, Side CA, and Side AB have Angle degree α, Angle degree β, and Angle degree γ, respectively, in the triangle;

Angle degree θ is formed between a c-axis and a longitudinal direction of Side BC in the top view;

both of the following two mathematical formulae (V) and (VI) are satisfied; and $$\text{the length La} < \text{the length Lb} < \text{the length Lc} \quad (V)$$

$$\text{Angle degree } \alpha < \text{Angle degree } \beta < \text{Angle degree } \gamma \quad (VI)$$

any one of Group Ca consisting of the following three mathematical formulae (VIIa), (VIIIa), and (IXa), Group Cb consisting of the following three mathematical formulae (VIIb), (VIIIb), and (IXb), Group Cc consisting of the following three mathematical formulae (VIIc), (VIIIc), and (IXc), or Group Cd consisting of the following three mathematical formulae (VIId), (VIIId), and (IXd) is satisfied:

Group Ca:

$$20 \text{ degrees} \leq \text{Angle degree } \alpha \leq 30 \text{ degrees} \quad (VIIa),$$

$$75 \text{ degrees} \leq \text{Angle degree } \gamma \leq 90 \text{ degrees} \quad (VIIIa), \text{ and}$$

$$-30 \text{ degrees} \leq \text{Angle degree } \theta \leq 30 \text{ degrees} \quad (IXa)$$

Group Cb:

$$30 \text{ degrees} \leq \text{Angle degree } \alpha \leq 35 \text{ degrees} \quad (VIIb),$$

$$72.5 \text{ degrees} \leq \text{Angle degree } \gamma \leq 75 \text{ degrees} \quad (VIIIb), \text{ and}$$

$$-20 \text{ degrees} \leq \text{Angle degree } \theta \leq 20 \text{ degrees} \quad (IXb)$$

Group Cc:
30 degrees≤Angle degree α≤35 degrees (VIIc),
75 degrees<Angle degree γ≤85 degrees (VIIIc), and
−10 degrees≤Angle degree θ≤10 degrees (IXc)
Group Cd:
30 degrees≤Angle degree α≤35 degrees (VIId),
85 degrees<Angle degree γ≤90 degrees (VIIId), and
−10 degrees≤Angle degree θ≤20 degrees (IXd)

The present invention provides a specific shape of a nitride semiconductor light-emitting diode having high light extraction efficiency.

DETAILED DESCRIPTION OF THE EMBODIMENTS

The present invention will be described below with reference to the drawings.

DEFINITION OF THE TERMS

In the instant specification, the term "scalene triangle" means a triangle having three sides having different lengths from one another and three angles having different degrees from one another.

The term "anisotropic orientation distribution" means distribution of light emitted from a non-polar or semi-polar active layer. Generally, it means distribution of light emitted from an active layer having a principal plane of an m-plane. Light emitted from the active layer having a principal plane of an m-plane has a high light intensity along a c-axis; however, has a low light intensity along an a-axis.

The term "isotropic orientation distribution" means distribution of light emitted from a polar active layer, namely, an active layer having a principal plane of a c-axis. The a-axis intensity of light emitted from the active layer having a principal plane of a c-plane is substantially the same as the m-axis intensity of the light.

Plus and minus of Angle degree θ will be defined in the example 2, which will be described later.

Example 1

Figure 1:
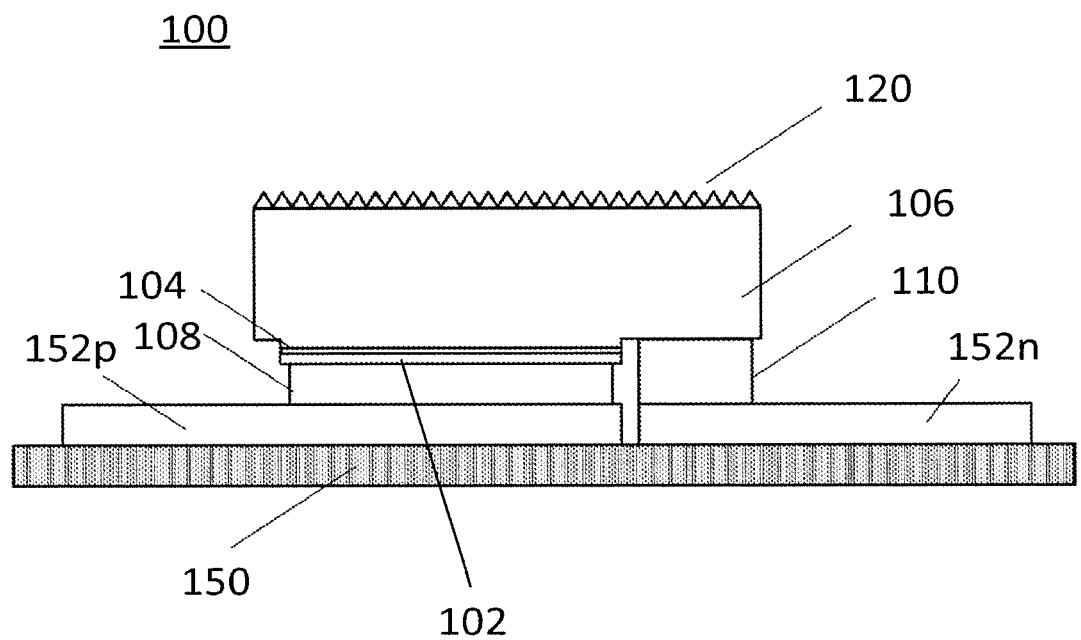
FIG. 1 shows a cross-sectional view of a nitride semiconductor light-emitting diode 100 supposed in the simulation according to the example 1.

The following simulation was performed. FIG. 1 shows a cross-sectional view of a nitride semiconductor light-emitting diode 100 supposed in the simulation according to the example 1. Similarly to a conventional nitride semiconductor light-emitting diode, as shown in FIG. 1, a nitride semiconductor light-emitting diode 100 comprised a non-polar or semi-polar p-type nitride semiconductor layer 102, a non-polar or semi-polar active layer 104, a non-polar or semi-polar n-type nitride semiconductor layer 106, a p-side electrode 108, and an n-side electrode 110. The active layer 104 was interposed between the p-type nitride semiconductor layer 102 and the n-type nitride semiconductor layer 106. An m-plane, namely, a (1-100) plane, was selected as a non-polar plane in the simulation according to the example 1.

The n-type nitride semiconductor layer 106 functioned as a substrate of the nitride semiconductor light-emitting diode 100. The active layer 104 and the p-type nitride semiconductor layer 102 were provided under the n-type nitride semiconductor layer 106. An uneven structure 120 was provided on the upper surface of the n-type nitride semiconductor layer 106. The p-type nitride semiconductor layer 102 and the n-type nitride semiconductor layer 106 were electrically connected to the p-side electrode 108 and the n-side electrode 110, respectively. In the simulation, a voltage was applied between the p-side electrode 108 and the n-side electrode 110 to emit light from the active layer 104.

The nitride semiconductor light-emitting diode 100 was disposed on a mounting board 150. The mounting board 150 comprised a first electrode 152$p$ and a second electrode 152$n$ on the surface thereof. The first electrode 152$p$ and the second electrode 152$n$ were electrically connected to the p-side electrode 108 and the n-side electrode 110, respectively.

The nitride semiconductor light-emitting diode 100 had a thickness of 100 micrometers. Although not shown, the nitride semiconductor light-emitting diode 100 may be coated with resin to give a nitride semiconductor light-emitting diode chip (hereinafter, merely referred to as a "chip"). In other words, the chip comprises the nitride semiconductor light-emitting diode 100 and the resin coating it.

The light emitted from such a chip was simulated with a simulator utilizing a ray tracing method. The number of the rays in the ray tracing method was 100,000. This number was adequate for the calculation of the light extraction efficiency.

Figure 2:
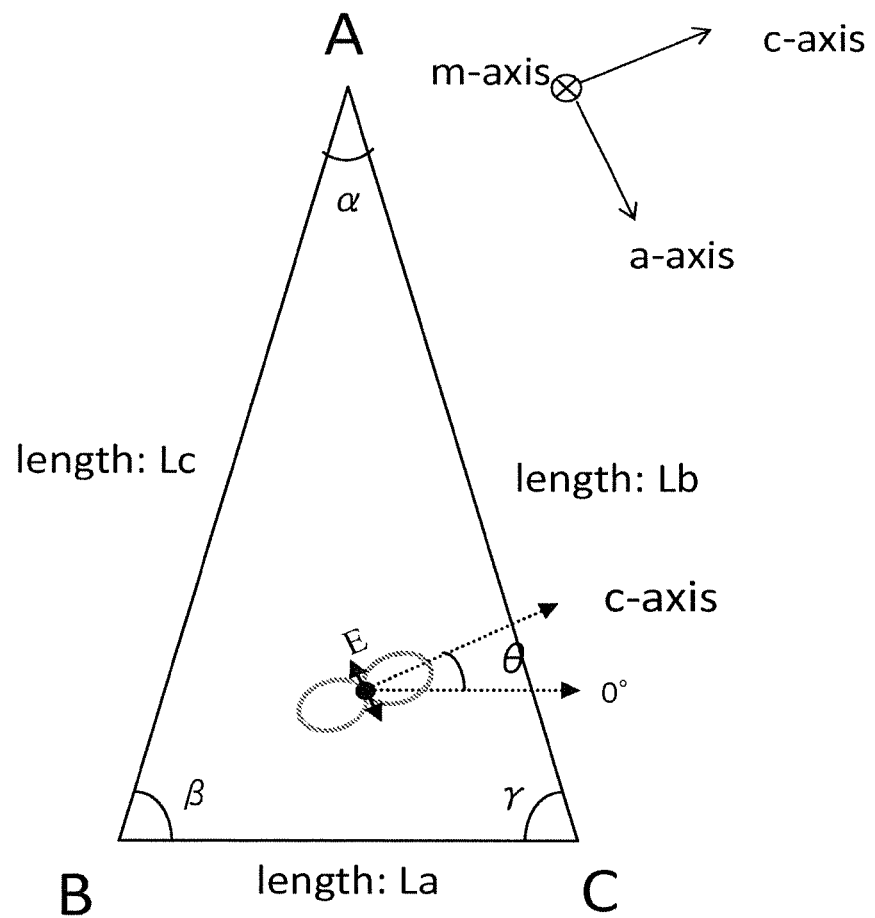
FIG. 2 shows a top view of the nitride semiconductor light-emitting diode 100 supposed in the simulation according to the example 1.

FIG. 2 shows a top view of the nitride semiconductor light-emitting diode 100 supposed in the simulation according to the example 1. Needless to say, this top view corresponds to the drawing viewed from the normal line of the active layer 104. As shown in FIG. 2, the nitride semiconductor light-emitting diode 100 according to the example 1 has a shape of an isosceles triangle having three corners A, B, and C in the top view.

As shown in FIG. 2, the nitride semiconductor light-emitting diode 100 had a triangular shape consisting of Side BC, Side CA, and Side AB having a length La, a length Lb, and a length Lc, respectively, in the top view. In this triangle, angles opposite to Side BC, Side CA, and Side AB had Angle degree $\alpha$, Angle degree $\beta$ and Angle degree $\gamma$, respectively. In the top view, Angle degree $\theta$ was formed between the c-axis and the longitudinal direction of Side BC. Needless to say, Angle degree $\beta$ was equal to Angle degree $\gamma$, and to a value of (180−Angle degree $\alpha$)/2. The length Lb was equal to the length Lc.

Figure 3:
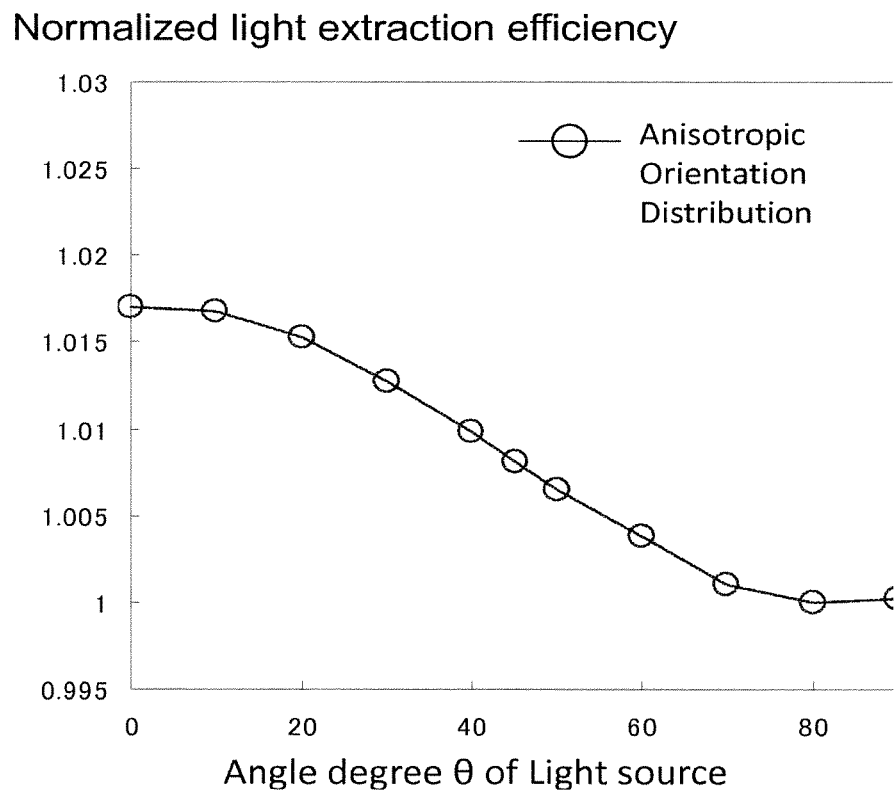
FIG. 3 shows a result of the simulation of the anisotropic light extraction efficiency in the example 1.

FIG. 3 shows a result of the simulation of the anisotropic light extraction efficiency in the example 1. In FIG. 3, Angle degree $\alpha$ was fixed to be equal to 20 degrees. Furthermore, the light extraction efficiency was simulated, while Angle degree $\theta$ of the light source was varied from zero degrees to 90 degrees. In FIG. 3, the horizontal axis represents Angle degree $\theta$ of the light source, and the vertical axis represents normalized light extraction efficiency. The normalized light extraction efficiency was obtained by dividing a value of the light extraction efficiency simulated at Angle degree $\theta$ by the smallest value of the light extraction efficiency. The smallest value of the light extraction efficiency means the smallest value among various values of the light extraction efficiency obtained while Angle degree $\theta$ of the light source was varied from zero degrees to 90 degrees.

Figure 4:
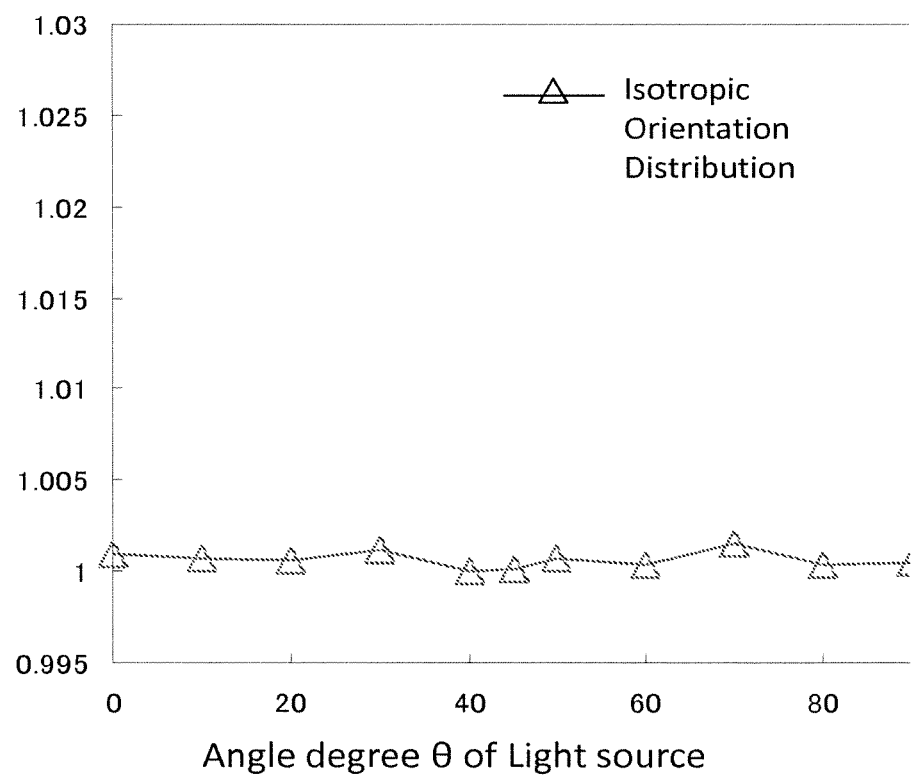
FIG. 4 shows a result of the isotropic light extraction efficiency.

FIG. 4 shows a result of an isotropic light extraction efficiency simulated similarly to the case of FIG. 3, except that a principal plane of a c-plane, namely, a (0001) plane, was employed instead of an m-plane.

As is clear from comparison of FIG. 3 to FIG. 4, in the case of a c-plane, the light extraction efficiency was constant regardless of the value of Angle degree $\theta$ of the light source. On the other hand, in the case of an m-plane, the light extraction efficiency was varied depending on Angle degree $\theta$ of the light source. As is clear from FIG. 3, the light extraction efficiency is improved with a decrease in Angle degree $\theta$ of the light source.

Figure 5:
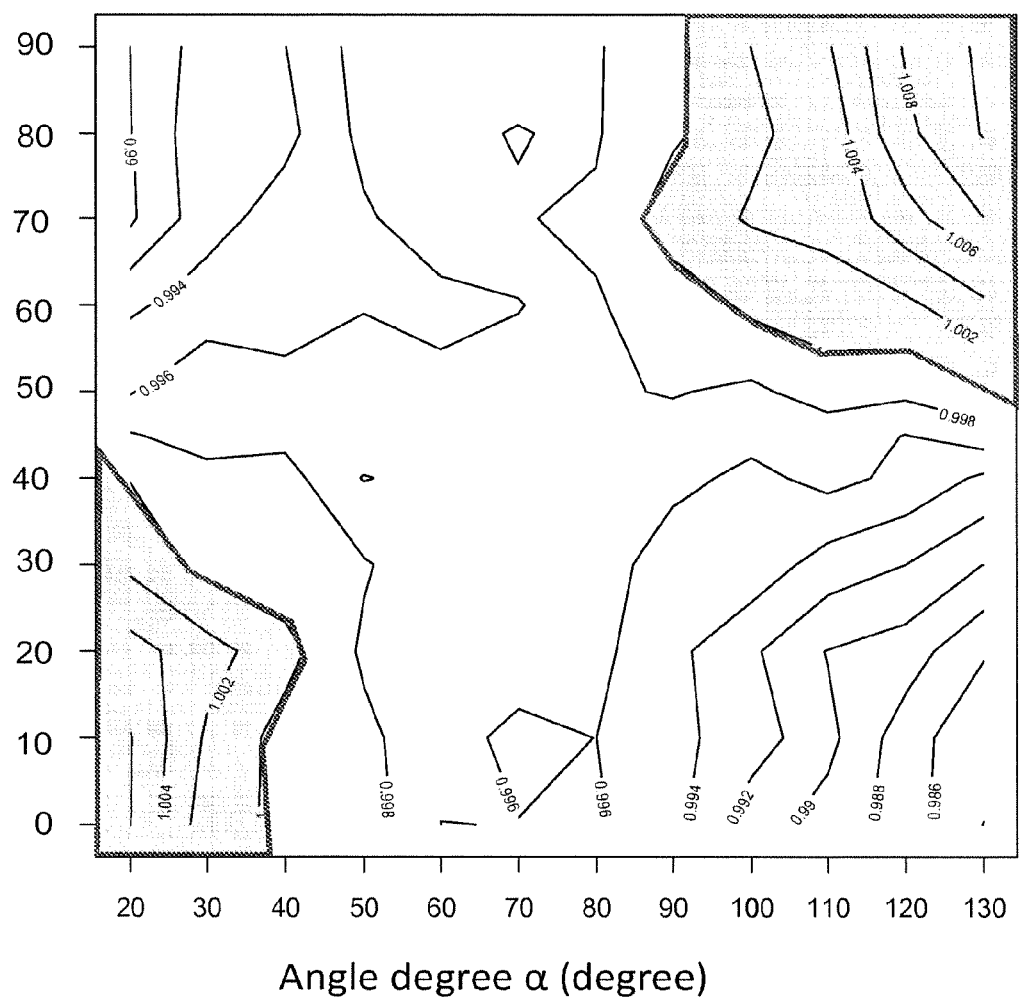
FIG. 5 is a graph showing the results of the simulation of the light extraction efficiency in the example 1.

FIG. 5 is a graph showing the results of the simulation of the light extraction efficiency in the example 1. In FIG. 5, Angle degree $\alpha$ was varied within the range of 20 degrees and 130 degrees independently. Angle degree $\theta$ of the light source was varied within the range of 0 degrees and 90 degrees independently. In FIG. 5, the horizontal axis represents Angle degree $\alpha$, and the vertical axis represents Angle degree $\theta$ of the light source. The values included in the graph shown in FIG. 5 are values obtained by dividing the light extraction efficiency of the anisotropic orientation distribution (See FIG. 3) by the light extraction efficiency of the isotropic orientation distribution (See FIG. 4). Hereinafter, this value is referred to as "light extraction ratio".

In the case where the light extraction ratio is not less than 1, a non-polar or semi-polar nitride semiconductor light-emitting diode having Angle degree $\alpha$ and Angle degree $\theta$ has the same light extraction efficiency as or higher light extraction efficiency than a polar nitride semiconductor light-emitting diode having the same Angle degree $\alpha$ and the same Angle degree $\theta$. On the other hand, where the light extraction ratio is less than 1, a non-polar or semi-polar nitride semiconductor light-emitting diode having Angle degree $\alpha$ and Angle degree $\theta$ has lower light extraction efficiency than a polar nitride semiconductor light-emitting diode having the same Angle degree $\alpha$ and the same Angle degree $\theta$.

As is clear from FIG. 5, if either Group Aa consisting of the following two mathematical formulae (Ia) and (IIa) or Group Ab consisting of the following two mathematical formulae (Ib) and (IIb) is satisfied, the light extraction ratio is not less than 1. In other words, the range where the light extraction ratio is not less than 1 is defined by the Group Aa and the Group Ab.

Group Aa: 20 degrees≤Angle degree $\alpha$≤40 degrees (Ia) and 0 degrees≤Angle degree $\theta$≤40 degrees (IIa)

Group Ab: 90 degrees≤Angle degree $\alpha$≤130 degrees (Ib) and 50 degrees≤Angle degree $\theta$≤90 degrees (IIb)

Regarding the Group Aa, see the lower left of FIG. 5. Regarding the Group Ab, see the upper right of FIG. 5. As just described, the example 1 provides a specific shape of the nitride semiconductor light-emitting diode having high light extraction efficiency.

Example 2

Figure 6:
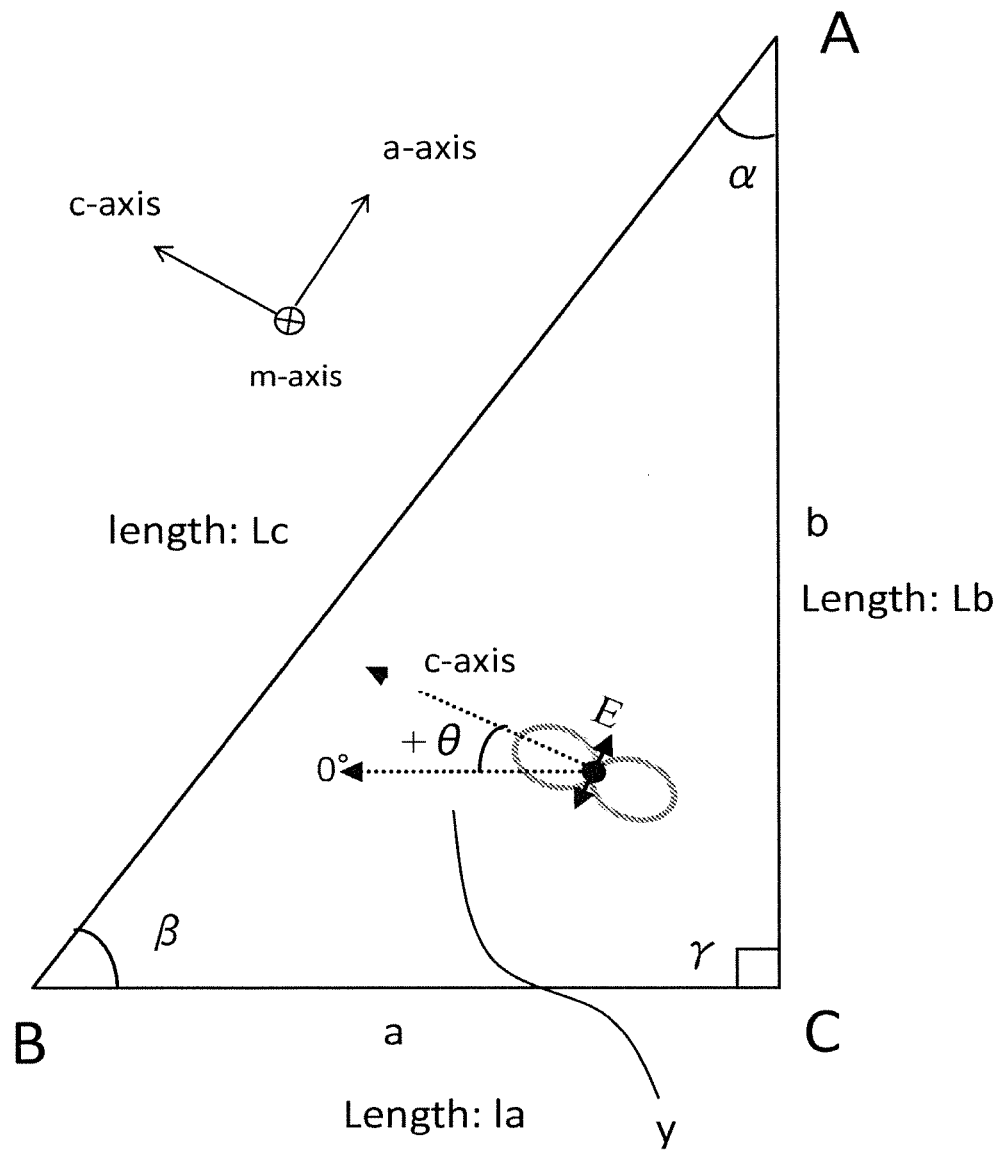
FIG. 6 shows a top view of a nitride semiconductor light-emitting diode 100 supposed in the simulation according to the example 2.

FIG. 6 shows a top view of the nitride semiconductor light-emitting diode 100 supposed in the simulation according to the example 2. Needless to say, this top view corresponds to the drawing viewed from the normal line of the active layer 104. As shown in FIG. 6, the nitride semiconductor light-emitting diode 100 according to the example 2 had a shape of a right triangle having three corners A, B, and C in the top view.

As shown in FIG. 6, the nitride semiconductor light-emitting diode 100 had a triangular shape consisting of Side BC, Side CA, and Side AB having a length La, a length Lb, and a length Lc, respectively, in the top view. In this triangle, angles opposite to Side BC, Side CA, and Side AB had Angle degree $\alpha$, Angle degree $\beta$ and Angle degree $\gamma$, respectively. In the top view, Angle degree of the light source was formed between the c-axis and the longitudinal direction of Side BC. The Angle degree $\gamma$ was fixed to be equal to 90 degrees. Needless to say, Angle degree $\alpha$ was equal to a value of (90−Angle degree $\beta$).

In the example 2, plus and minus of Angle degree $\theta$ of the light source are defined as below. As shown in FIG. 6, the plus corresponds to the case where an arrow y parallel to a direction from the corner C having Angle degree $\gamma$ to the corner B having Angle degree $\beta$ is rotated about the light source in such a manner that the arrow y is brought closer to the corner A having Angle degree α. On the other hand, the minus corresponds to the case where an arrow y is rotated about the light source in such a manner that the arrow y is brought farther away from the corner A having Angle degree α. This definition of the plus and the minus of Angle degree θ of light source is also applied to the example 3.

Figure 7:
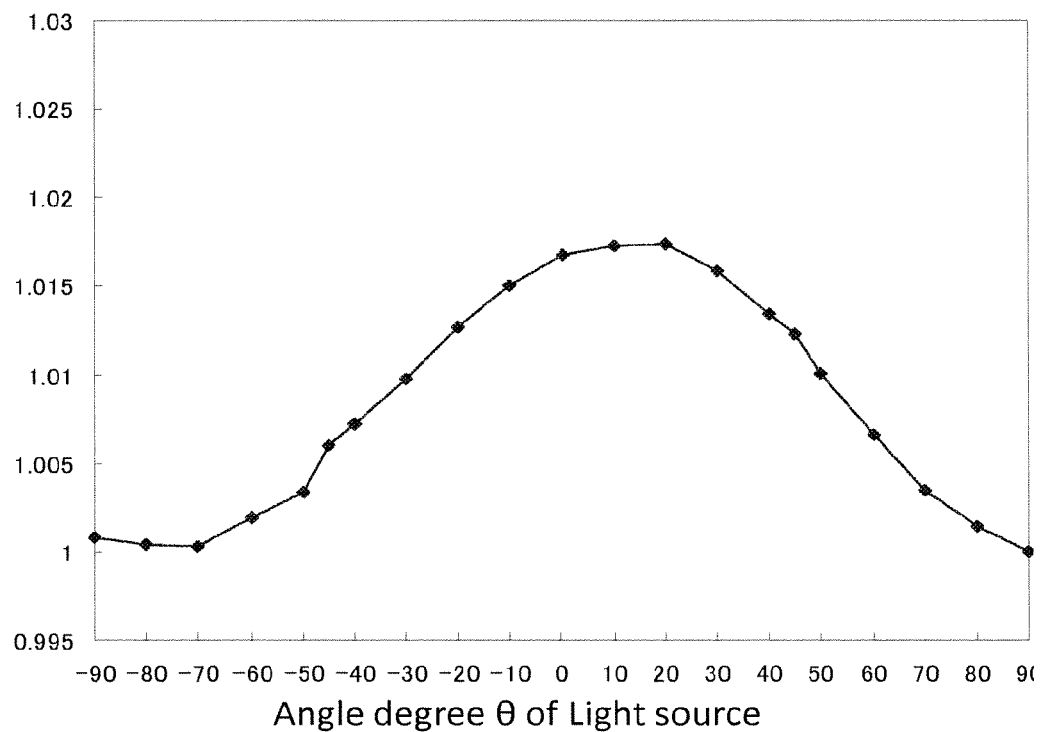
FIG. 7 shows a result of the simulation of the anisotropic light extraction efficiency in the example 2.

FIG. 7 shows a result of the simulation of the anisotropic light extraction efficiency in the example 2. In FIG. 7, Angle degree α was fixed to be equal to 20 degrees. Furthermore, the light extraction efficiency was simulated, while Angle degree θ of the light source was varied from −90 degrees to +90 degrees. In FIG. 7, the horizontal axis represents Angle degree θ of the light source, and the vertical axis represents normalized light extraction efficiency. The normalized light extraction efficiency was obtained similarly to the case of the example 1. Although not shown, in the case of a c-plane, similarly to the example 1, the light extraction efficiency was substantially constant regardless of Angle degree θ of the light source. On the other hand, in the case of an m-plane, the light extraction efficiency was varied depending on the Angle degree θ of the light source.

Figure 8:
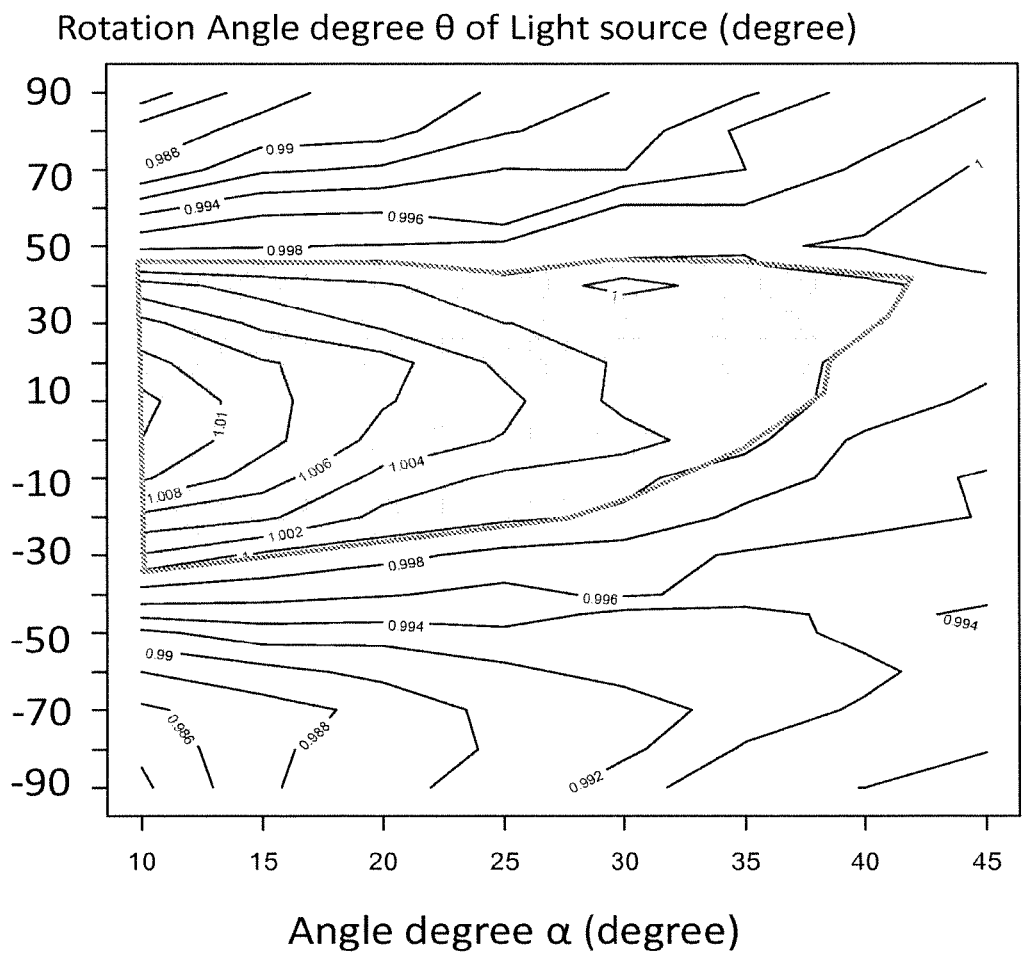
FIG. 8 is a graph showing the results of the simulation of the light extraction efficiency in the example 2.

FIG. 8 is a graph showing the results of the simulation of the light extraction efficiency in the example 2. In FIG. 8, Angle degree α was varied within the range of 10 degrees and 45 degrees independently. Angle degree θ of the light source was varied within the range of −90 degrees and 90 degrees independently. In FIG. 8, the horizontal axis represents Angle degree α, and the vertical axis represents Angle degree θ of the light source. Similarly to the case of FIG. 5, the values included in the graph shown in FIG. 8 are values of the light extraction ratio.

As is clear from FIG. 8, if any one of Group Ba consisting of the following two mathematical formulae (IIIa) and (IVa), Group Bb consisting of the following two mathematical formulae (IIIb) and (IVb), or Group Bc consisting of the following two mathematical formulae (IIIc) and (IVc) is satisfied, the light extraction ratio is not less than 1. In other words, the range where the light extraction ratio is not less than 1 is defined by the Group Ba, the Group Bb, and the Group Bc.

Group Ba:     10 degrees≤Angle degree α≤30 degrees (IIIa) and −30 degrees≤Angle degree θ≤45 degrees (IVa)

Group Bb:     30 degrees<Angle degree α≤35 degrees (IIIb) and −25 degrees≤Angle degree θ≤45 degrees (IVb)

Group Bc:     35 degrees<Angle degree α≤40 degrees (IIIc) and 10 degrees≤Angle degree θ≤45 degrees (IVc)

As just described, the example 2 provides a specific shape of the nitride semiconductor light-emitting diode having high light extraction efficiency.

Example 3

Figure 9:
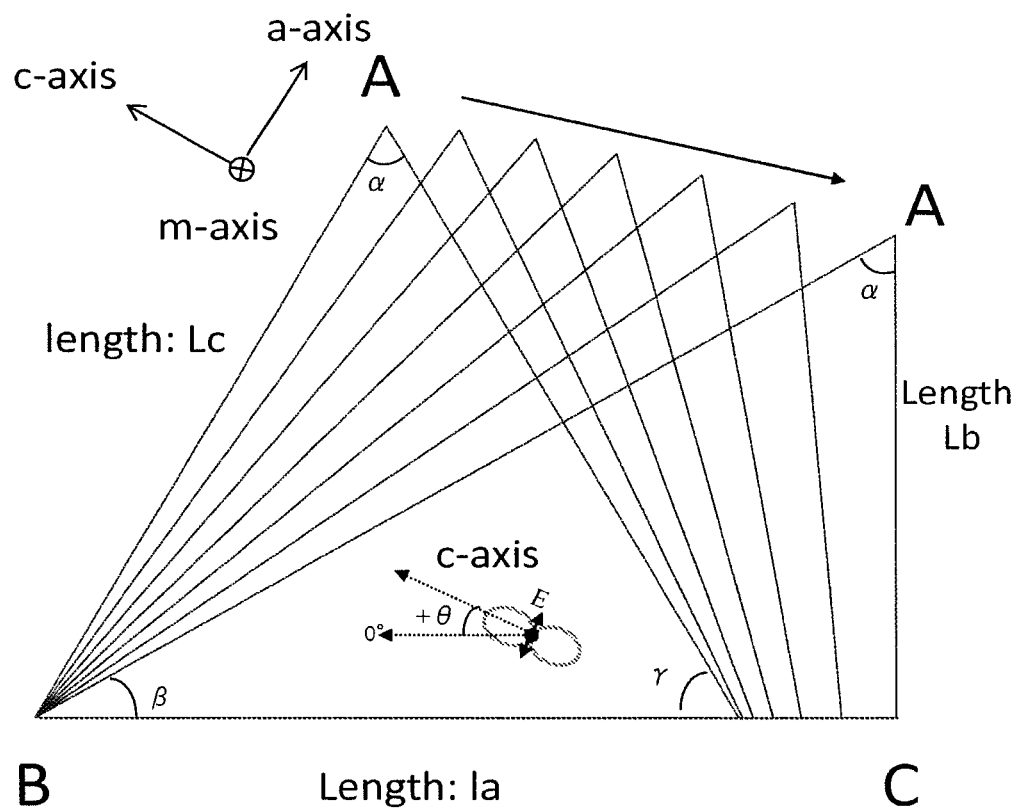
FIG. 9 shows a top view of a nitride semiconductor light-emitting diode 100 supposed in the simulation according to the example 3.

FIG. 9 shows a top view of the nitride semiconductor light-emitting diode 100 supposed in the simulation according to the example 3. Needless to say, this top view corresponds to the drawing viewed from the normal line of the active layer 104. As shown in FIG. 9, the nitride semiconductor light-emitting diode 100 according to the example 3 had a shape of a scalene triangle having three corners A, B, and C in the top view.

As shown in FIG. 9, the nitride semiconductor light-emitting diode 100 had a triangular shape consisting of Side BC, Side CA, and Side AB having a length La, a length Lb, and a length Lc, respectively, in the top view. In this triangle, angles opposite to Side BC, Side CA, and Side AB had Angle degree α, Angle degree β and Angle degree γ, respectively. In the top view, Angle degree θ of the light source was formed between the c-axis and the longitudinal direction of Side BC. In FIG. 9, the mathematical formulae: the length Lb<the length La<the length Lc and Angle degree β<Angle degree α=60 degrees<Angle degree γ are satisfied. However, when Angle degree α is less than 45 degrees, both of the following two mathematical formulae (V) and (VI) are satisfied.

the length La<the length Lb<the length Lc     (V)

Angle degree α<Angle degree β<Angle degree γ     (VI)

Figure 10:
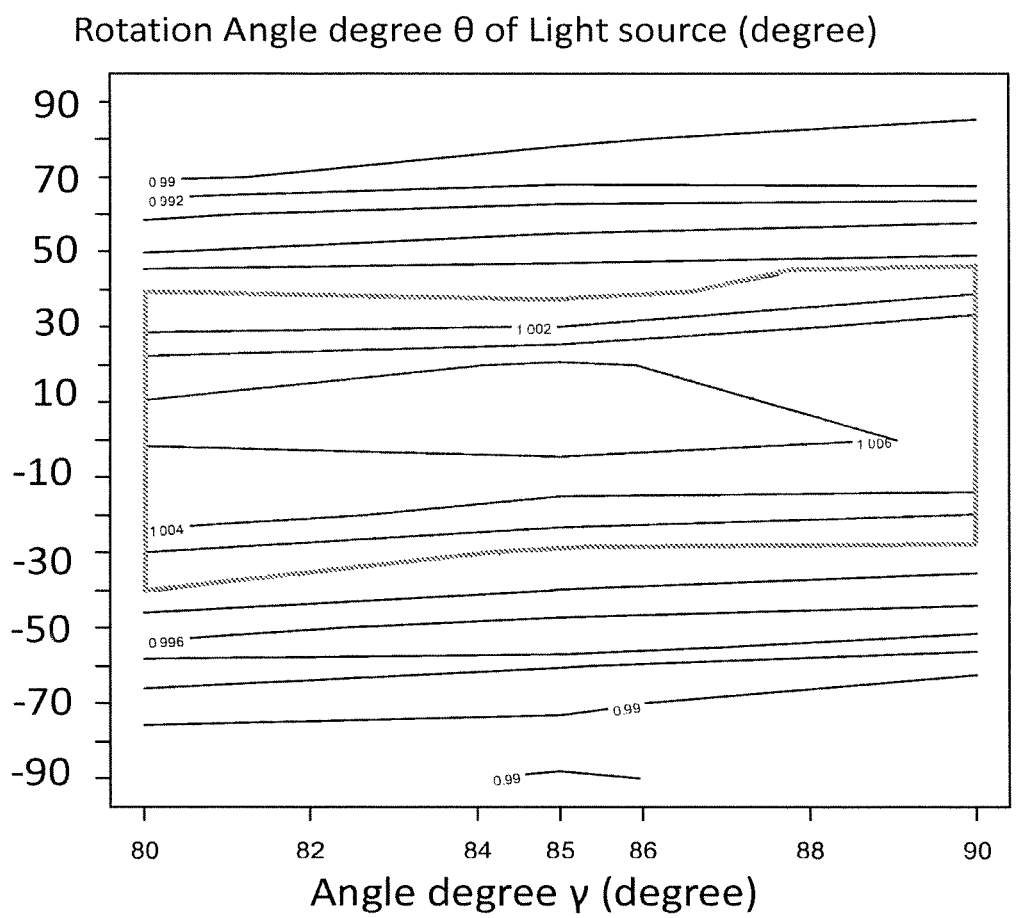
FIG. 10 shows a result of the simulation of the anisotropic light extraction efficiency in the example 3.

FIG. 10 shows a result of the simulation of the anisotropic light extraction efficiency in the example 3. In FIG. 10, Angle degree α was fixed to be equal to 20 degrees. Furthermore, the light extraction ratio was simulated, while Angle degree θ of the light source was varied from −90 degrees to +90 degrees and while Angle degree γ was varied from 80 degrees to 90 degrees.

Figure 11:
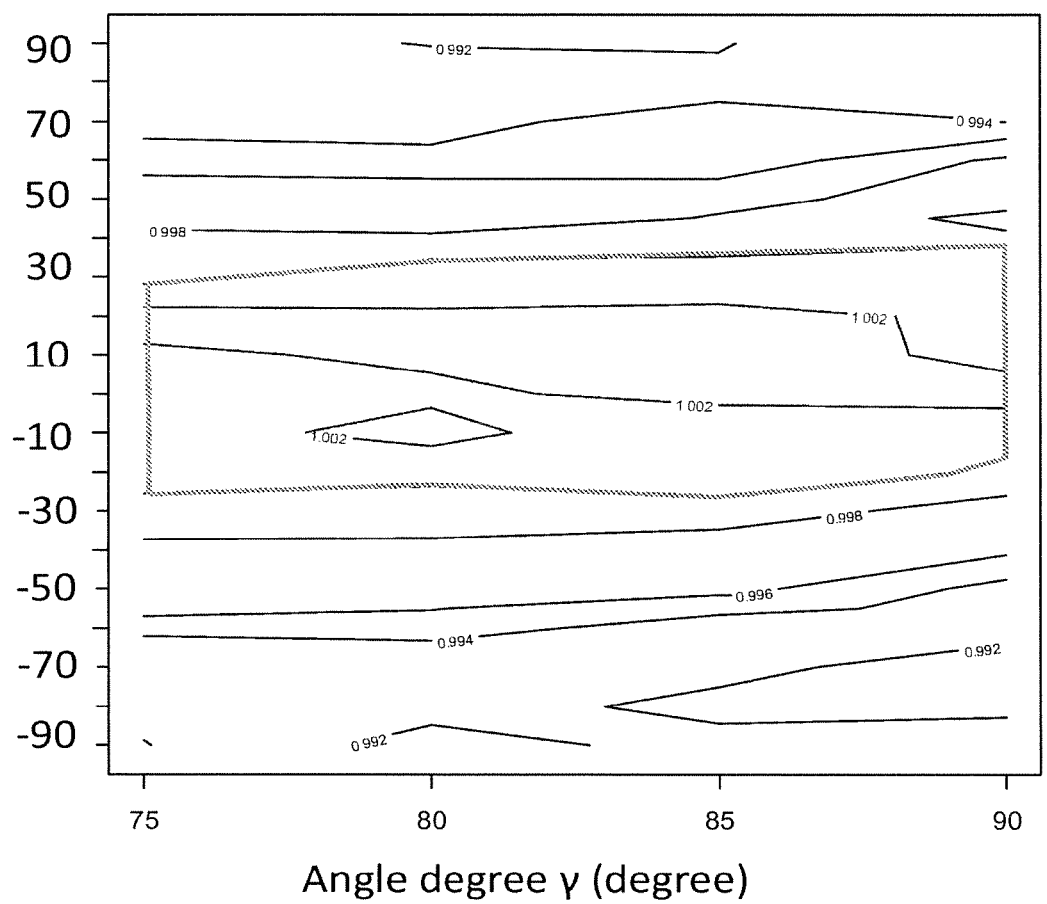
FIG. 11 shows a result of the simulation of the anisotropic light extraction efficiency in the example 3.

FIG. 11 shows a result of the simulation of the anisotropic light extraction efficiency in the example 3. In FIG. 11, Angle degree α was fixed to be equal to 30 degrees. Furthermore, the light extraction ratio was simulated, while Angle degree θ of the light source was varied from −90 degrees to +90 degrees and while Angle degree γ was varied from 75 degrees to 90 degrees.

Figure 12:
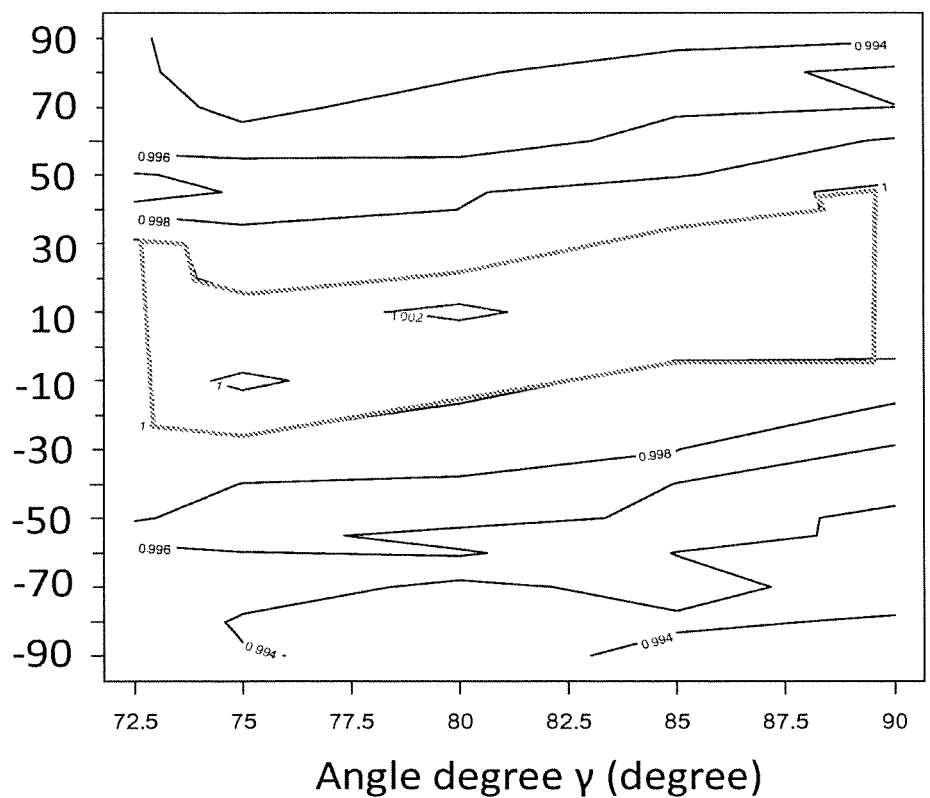
FIG. 12 shows a result of the simulation of the anisotropic light extraction efficiency in the example 3.
Figure 13:
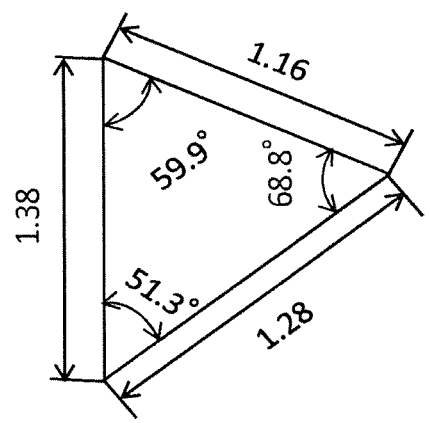
FIG. 13 shows a nitride semiconductor light-emitting diode disclosed in FIG. 3G included in Japanese Patent Application laid-open Publication No. 2012-023249A.
Figure 13:

FIG. 12 shows a result of the simulation of the anisotropic light extraction efficiency in the example 3. In FIG. 12, Angle degree α was fixed to be equal to 35 degrees. Furthermore, the light extraction ratio was simulated, while Angle degree θ of the light source was varied from −90 degrees to +90 degrees and while Angle degree γ was varied from 72.5 degrees to 90 degrees. In FIG. 10-FIG. 12, the horizontal axis represents Angle degree γ, and the vertical axis represents Angle degree θ of the light source. The values included in the graph shown in each of FIG. 10-FIG. 12 are values of the light extraction ratio.

As is clear from FIG. 10 and FIG. 11, if Group Ca consisting of the following three mathematical formulae (VIIa), (VIIIa), and (IXa) is satisfied, the light extraction ratio is not less than 1. In other words, the range where the light extraction ratio is not less than 1 is defined by the group Ca.

Group Ca:

20 degrees≤Angle degree α≤30 degrees     (VIIa), 75 degrees≤Angle degree γ≤90 degrees     (VIIIa), and −30 degrees≤Angle degree θ≤30 degrees     (IXa)

As is clear from FIG. 11 and FIG. 12, if any one of Group Cb consisting of the following three mathematical formulae (VIIb), (VIIIb), and (IXb), Group Cc consisting of the following three mathematical formulae (VIIc), (VIIIc), and (IXc), or Group Cd consisting of the following three mathematical formulae (VIId), (VIIId), and (IXd) is satisfied, the light extraction ratio is not less than 1. In other words, the range where the light extraction ratio is not less than 1 is defined by the Group Cb, the Group Cc, and the Group Cd.

Group Cb:

30 degrees≤Angle degree α≤35 degrees     (VIIb), 72.5 degrees≤Angle degree γ≤75 degrees     (VIIIb), and −20 degrees≤Angle degree θ≤20 degrees     (IXb)

Group Cc:

30 degrees≤Angle degree α≤35 degrees     (VIIc), 75 degrees<Angle degree γ≤85 degrees     (VIIIc), and −10 degrees≤Angle degree θ≤10 degrees     (IXc)

Group Cd:

$$30 \text{ degrees} \leq \text{Angle degree } \alpha \leq 35 \text{ degrees} \quad \text{(VIId)},$$

$$85 \text{ degrees} < \text{Angle degree } \gamma \leq 90 \text{ degrees} \quad \text{(VIIId), and}$$

$$-10 \text{ degrees} \leq \text{Angle degree } \theta \leq 20 \text{ degrees} \quad \text{(IXd)}$$

INDUSTRIAL APPLICABILITY

The nitride semiconductor light-emitting diode according to the present invention can be used for a ceiling light or an automotive head lamp.

REFERENTIAL SIGNS LIST 100 nitride semiconductor light-emitting diode
102 p-type nitride semiconductor layer
104 active layer
106 n-type nitride semiconductor layer
108 p-side electrode
110 n-side electrode
120 uneven structure
150 mounting board
152p first electrode
152n second electrode

The invention claimed is:

1. A nitride semiconductor light-emitting diode comprising:
   a non-polar or semi-polar p-type nitride semiconductor layer;
   a non-polar or semi-polar active layer;
   a non-polar or semi-polar n-type nitride semiconductor layer;
   a p-side electrode; and
   an n-side electrode, wherein:
   the active layer is interposed between the p-type nitride semiconductor layer and the n-type nitride semiconductor layer,
   the p-type nitride semiconductor layer and the n-type nitride semiconductor layer are electrically connected to the p-side electrode and the n-side electrode, respectively,
   the nitride semiconductor light-emitting diode has a shape of a triangle in a top view thereof, and has a shape of a rectangle in a side view thereof,
   the nitride semiconductor light-emitting diode has a shape of a triangle composed of Side BC, Side CA, and Side AB having a length of La, a length of Lb, and a length of Lc, respectively, in a top view of the nitride semiconductor light-emitting diode,
   angles opposite to Side BC, Side CA, and Side AB have Angle degree $\alpha$, Angle degree $\beta$, and Angle degree $\gamma$, respectively, in the triangle,
   Angle degree $\theta$ is formed between a c-axis and a longitudinal direction of Side BC in the top view,
   the length Lb is equal to the length Lc, and
   either Group Aa consisting of the following two mathematical formulae (Ia) and (IIa) or Group Ab consisting of the following two mathematical formulae (Ib) and (IIb) is satisfied, Group Aa:
   $$20 \text{ degrees} \leq \text{Angle degree } \alpha \leq 40 \text{ degrees (Ia) and } 0 \text{ degrees} \leq \text{Angle degree } \theta \leq 40 \text{ degrees (IIa)}, \text{ and}$$

Group Ab:
   $$90 \text{ degrees} \leq \text{Angle degree } \alpha \leq 130 \text{ degrees (Ib) and } 50 \text{ degrees} \leq \text{Angle degree } \theta \leq 90 \text{ degrees (IIb)}.$$

2. The nitride semiconductor light-emitting diode according to claim wherein
   the p-type nitride semiconductor layer, the active layer, and the n-type nitride semiconductor layer have a principal surface of an m-plane.

* * * * *